US012739993B2

(12) United States Patent
Yin et al.

(10) Patent No.: US 12,739,993 B2
(45) Date of Patent: Sep. 15, 2026

(54) CABINET ASSEMBLY AND SHELF WITH PITCH-DEFINED COMPATIBILITY FOR PLUG-IN UNITS

(71) Applicant: DELTA ELECTRONICS, INC., Taoyuan City (TW)

(72) Inventors: Guan-Chen Yin, Taoyuan City (TW); Ching-Tang Chang, Taoyuan City (TW); Chi-Shou Ho, Taoyuan City (TW); Chen-Chiang Su, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 51 days.

(21) Appl. No.: 18/947,764

(22) Filed: Nov. 14, 2024

(65) Prior Publication Data

US 2025/0159826 A1 May 15, 2025

Related U.S. Application Data

(60) Provisional application No. 63/598,866, filed on Nov. 14, 2023.

(51) Int. Cl.
*H05K 5/02* (2006.01)

(52) U.S. Cl.
CPC ......... *H05K 5/0286* (2013.01); *H05K 5/0208* (2013.01); *H05K 5/0221* (2013.01)

(58) Field of Classification Search
CPC .. H05K 5/0286; H05K 5/0208; H05K 5/0221; H05K 7/1492; H05K 7/1487; H05K 7/14; H05K 5/0217
See application file for complete search history.

(56) References Cited

U.S. PATENT DOCUMENTS 6,556,437 B1 * 4/2003 Hardin ............... H05K 7/20172 361/679.48
8,611,099 B2 * 12/2013 Sun ...................... H05K 7/1489 361/801
8,953,328 B2 2/2015 Lin
9,265,181 B2 * 2/2016 Tang .................. H05K 7/20781
(Continued)

FOREIGN PATENT DOCUMENTS

CN 108717323 A 10/2018
CN 219576106 U 8/2023
(Continued)

*Primary Examiner* — Sagar Shrestha
(74) *Attorney, Agent, or Firm* — HDLS IPR SERVICES; Chun-Ming Shih

(57) ABSTRACT

This disclosure is directed to a fool-proof structure having a shelf and a plug-in unit. The shelf is defined with a socket and an opening, and a stopping portion and an actuating portion are provided on the socket, and the actuating portion and the stopping portion are respectively communicated to the opening. The plug-in unit has an elastic arm. A stopping wall and an actuating slope of the elastic arm protrude from the plug-in unit. A first pitch is defined from the actuating portion to the stop portion, and a second pitch is defined from the actuating slope to the stopping wall. The first pitch may be configured to be greater than the second pitch, so that the actuating portion may push the actuating slope to deflect the elastic arm before the stopping wall arrives the stop part when the plug-in unit is inserted into the socket.

12 Claims, 16 Drawing Sheets

(56) References Cited

U.S. PATENT DOCUMENTS

| | | | | |
|---|---|---|---|---|
| 11,612,067 | B2 | 3/2023 | Chang et al. | |
| 2008/0013271 | A1* | 1/2008 | Peng | G06F 1/187 361/825 |
| 2008/0266817 | A1* | 10/2008 | Li | H05K 5/0247 361/747 |
| 2012/0293975 | A1* | 11/2012 | Liang | G06F 1/188 361/807 |
| 2013/0094156 | A1* | 4/2013 | Wang | G06F 1/188 361/747 |
| 2013/0279123 | A1* | 10/2013 | Lin | H05K 7/1487 361/747 |
| 2015/0208544 | A1* | 7/2015 | Liao | H05K 7/1492 361/679.01 |
| 2022/0174837 | A1* | 6/2022 | Antaran | H05K 7/1492 |
| 2022/0394867 | A1* | 12/2022 | Chang | G06F 1/183 |
| 2024/0414863 | A1* | 12/2024 | Chang | H05K 5/023 |

FOREIGN PATENT DOCUMENTS

| | | | |
|---|---|---|---|
| TW | I763585 | B | 5/2022 |
| TW | 202247790 | A | 12/2022 |

* cited by examiner 200
210
211
221
222
210
211
310
221
330
320
222
330
220

CABINET ASSEMBLY AND SHELF WITH PITCH-DEFINED COMPATIBILITY FOR PLUG-IN UNITS

CROSS-REFERENCE TO RELATED APPLICATION

This patent application claims the benefit of U.S. Provisional Patent Application No. 63/598,866, filed Nov. 14, 2023, which is incorporated by reference herein.

BACKGROUND OF THE INVENTION

Technical Field

This disclosure is directed to a shelf and a plug-in unit of a server cabinet, in particular to a fool-proof structure with an elastic arm applied to a shelf and a plug-in unit.

Description of Related Art

A power supply cabinet of related art is generally compatible with various load voltages. Therefore, multiple plug-in power units with various operation voltages may be inserted in the rack shelf of the power supply cabinet. In order to prevent the power units from being connected to unsuitable loads, fool-proof structures corresponding to the cabinet and the power units are generally provided. In general, each fool-proof structure has a protrusion piece used as a stopper and corresponding gaps disposed on counterpart to allow passing. However, the fool-proof structures should be disposed at various locations corresponding to various performances (or specifications). Only several variations of fool-proof structures may be disposed in Generally a limited space on the opening edge of the socket can allow only several variations of fool-proof structures to be disposed. Moreover, when the predetermined performances of the cabinet are modified, it is not easy to correspondingly modify the fool-proof structure.

In views of this, in order to solve the above disadvantage, the inventor studied related technology and provided a reasonable and effective solution in this disclosure.

SUMMARY OF THE INVENTION

This disclosure is directed to a phase change heat transfer device and manufacturing method thereof having a capillary structure made by twice sintering.

This disclosure is directed to a fool-proof structure with an elastic arm applied to a shelf and a plug-in unit.

This disclosure is directed to a fool-proof structure for a shelf and a plug-in unit. The fool-proof structure has a shelf and a plug-in unit. The shelf has a socket, the socket has an opening, and a stopping portion and an actuating portion arranged on an internal surface of the socket, wherein the stopping portion and the actuating portion are respectively communicated to the opening. The plug-in unit has an elastic arm, the elastic arm arranged on one side of the plug-in unit, a stopping wall and an actuating slope of the elastic arm respectively protrude from the plug-in unit, wherein a plug-in direction toward an internal of the socket along a longitudinal direction of the socket is defined when the plug-in unit is inserted into the socket through the opening, the stopping wall is disposed to be perpendicular to the plug-in direction and face the plug-in direction, and the actuating slope is disposed to obliquely face the plug-in direction. A first pitch is defined from the actuating portion to the stopping portion along the plug-in direction, a second pitch is defined from the actuating slope to the stopping wall along the plug-in direction. The first pitch greater than or equal to the second pitch allows the actuating slope to press the actuating portion at a time when the stopping wall arrives the stopping portion or earlier than the time so as to deflect the elastic arm. The stopping wall is retreated into the plug-in unit to bypass the stopping portion when the elastic arm is deflected.

In one embodiment of this disclosure, the plug-in unit has a main body, the elastic arm has one end fixed with the main body, the elastic arm is extended along the plug-in direction, and the stopping wall and the actuating slope are arranged together on another end of the elastic arm.

In one embodiment of this disclosure, the plug-in unit has a main body, the elastic arm has one end fixed with the main body, the elastic arm is extended along a direction opposite to the plug-in direction, and the stopping wall and the actuating slope are arranged together on another end of the elastic arm.

In one embodiment of this disclosure, the stopping portion is arranged at the opening.

In one embodiment of this disclosure, a first path is disposed on an internal surface of the socket, and the first path is extended parallelly relative to the plug-in direction from the opening to the stopping portion.

In one embodiment of this disclosure, the actuating portion is arranged at the opening.

In one embodiment of this disclosure, a second path is disposed on an internal surface of the socket, and the second path is extended parallelly relative to the plug-in direction from the opening to the actuating portion.

In one embodiment of this disclosure, a releasing portion is defined on an internal surface of the socket, the elastic arm has a releasing slope, and a normal direction of the releasing slope is disposed obliquely along a direction opposite to the plug-in direction, the releasing slope is pressed by the releasing portion to deflect the elastic arm when the plug-in unit is retreated from the socket along the direction opposite to the plug-in direction.

In one embodiment of this disclosure, the elastic arm has a first latch, and the stopping wall and the releasing slope are disposed together on the first latch.

In one embodiment of this disclosure, the elastic arm has a second latch, and the actuating slope and the releasing slope are disposed together on the second latch.

In one embodiment of this disclosure, the fool-proof structure further has another plug-in unit having another elastic arm, another stopping wall and another actuating slope, and an another second pitch defined from the another actuating slope to the another stopping wall along the plug-in direction, the another second pitch different from the second pitch and less than the first pitch, and the another plug-in unit capable of plugging in the socket. When the another plug-in unit is plugged into the socket, the another actuating slope is pressed by the actuating portion at a time when the another stopping wall arrives the stopping portion or earlier than the time so as to deflect the elastic arm, so that the stopping wall is retreated into the plug-in unit to bypass the stopping portion when the elastic arm is deflected.

Accordingly, the fool-proof structure for the shelf and the plug-in unit according to this disclosure may be configured with the first pitches and the second pitches to allow a configuration of a stopping portion and an actuating portion to be compatible with some elastic arms with various performances.

A plug-in unit provided with a configuration having a first pitch greater than or equal to a second pitch can be plugged in a corresponding socket. In other words, multiple sockets may be disposed with various first pitches, and multiple plug-in units may be disposed with specific second pitches less than the first pitches of some sockets, thereby allowing the plug-in unit to exclude some sockets, so that each socket is downwardly compatible with plug-in units with corresponding performance and plug-in units with performances lower than the corresponding performance.

Therefore, elastic arms may be appropriately disposed corresponding to various power requirements, the fool-proof structure according to this disclosure is easy to be adjusted according to various operation requirements.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

FIG. 3 is a perspective view showing the plug-in unit plugged in the shelf according to the first embodiment of this disclosure.

DETAILED DESCRIPTION

Figure 1:
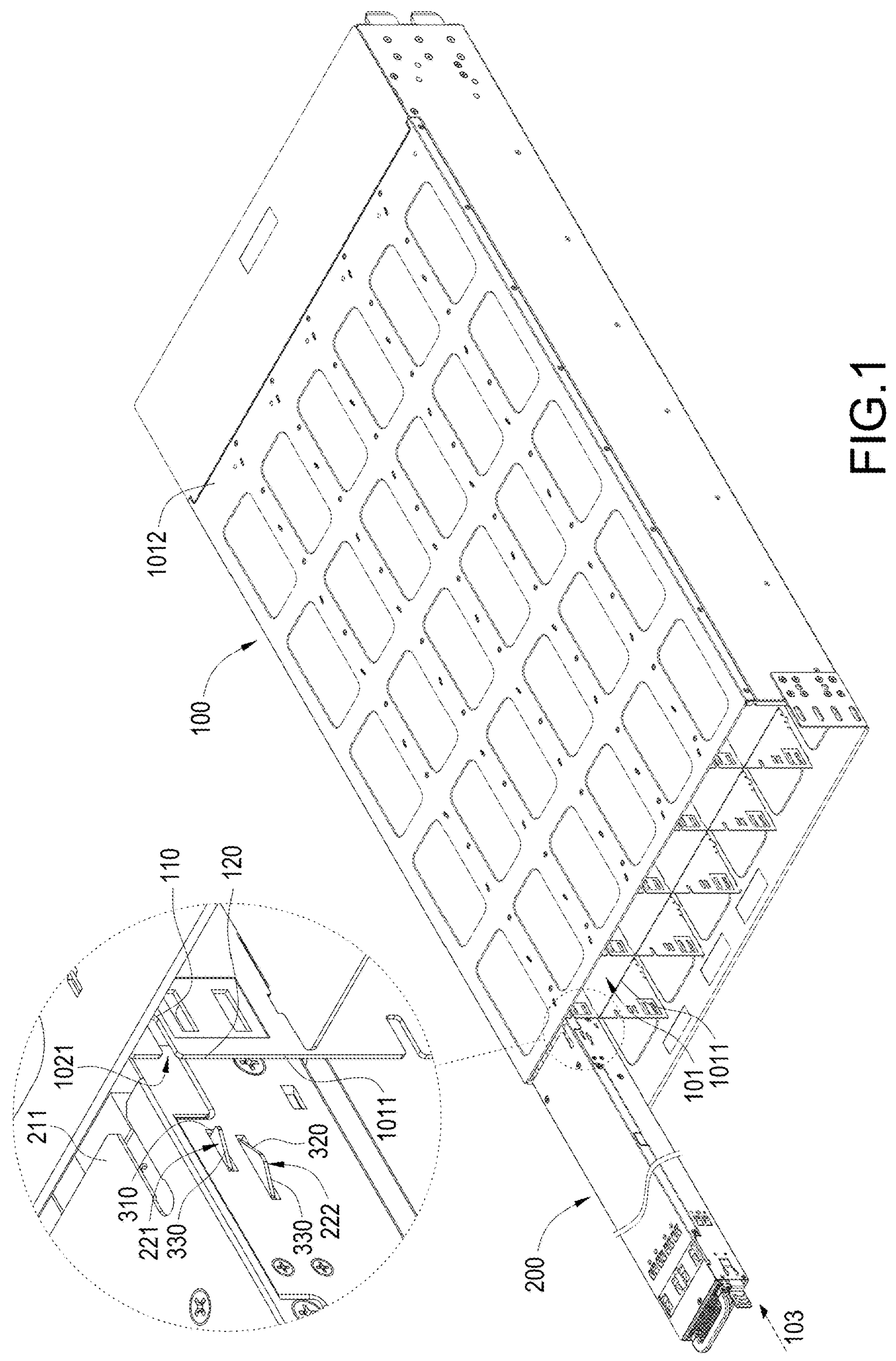
FIG. 1 is a perspective view showing a fool-proof structure for a shelf and a plug-in unit according to the first embodiment of this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

It should be understood that the orientations or positional relationships in this disclosure which are indicated by the terms such as "front side", "rear side", "left side", "right side", "front end", "rear end", "end", "vertical", "horizontal", "vertical", "top" and "bottom" are based on the orientations or positional relationships as shown in the drawings. These are only used for describing this disclosure and simplifying the description rather than indicating or implying that the device or element have a specific orientation or be constructed and operated in a specific orientation, and it should not be considered as limitations of the scopes of this disclosure.

The terms used herein without additional definition such as "substantially" and "approximately" are used to describe and illustrate small changes. When used in an event or situation, the term may include the precise moment at which the event or situation occurs, and a close approximation to moment the event or situation occurs. For example, when combined with a numerical value, the term may include a range of variation less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to +0.05%.

Detailed descriptions and technical contents of this disclosure is described in the flowing paragraph with reference to the drawings. However, the drawings are attached only for illustration and are not intended to limit this disclosure.

FIG. 1 is a perspective view showing a fool-proof structure for a shelf and a plug-in unit according to the first embodiment of this disclosure. The first embodiment of this disclosure provides a fool-proof structure for a shelf 100 and a plug-in unit 200 having a shelf 100 and at least one plug-in unit 200. According to this embodiment, the plug-in unit 200 is a power unit, but the scope of this disclosure should not be limited to the embodiment. The shelf 100 has at least one socket 101 allowing a plug-in unit 200 to plug therein, a plug-in direction 103 parallel to a longitudinal direction of the socket 101 is defined when a plug-in unit 200 is inserted into the socket 101, and the plug-in direction 103 is defined toward inside of the socket 101. According to an example of the power unit, the plug-in unit module 200 may be inserted into the socket 101 and positioned to couple a power connector (not shown in the figure) located at a bottom 1012 of the socket 101.

According to this embodiment, one socket 101 and one plug-in unit 200 of a shelf 100 are taken as an example and illustrated in following paragraphs. The socket 101 has an opening 1011 at one end thereof, and the socket 101 has a bottom 1012 at another end thereof opposite to the opening 1011. A stopping portion 110 and an actuating portion 120 are arranged on an internal surface of the socket 101, and the stopping portion 110 and the actuating portion 120 are respectively communicated with the opening 1011. The aforementioned "communicated with the opening 1011" means that no obstruction exists in an area between the stopping portion 110 (or the actuating portion 120) and the opening 1011 along the plug-in direction 103. According to this embodiment, a first path 1021 is provided on the internal surface of the socket 101. The first path 1021 is extended, along a direction parallel to the plug-in direction 103, from the opening 1011 to the stopping portion 110. The actuating portion 120 is arranged at the opening 1011.

Figure 2:
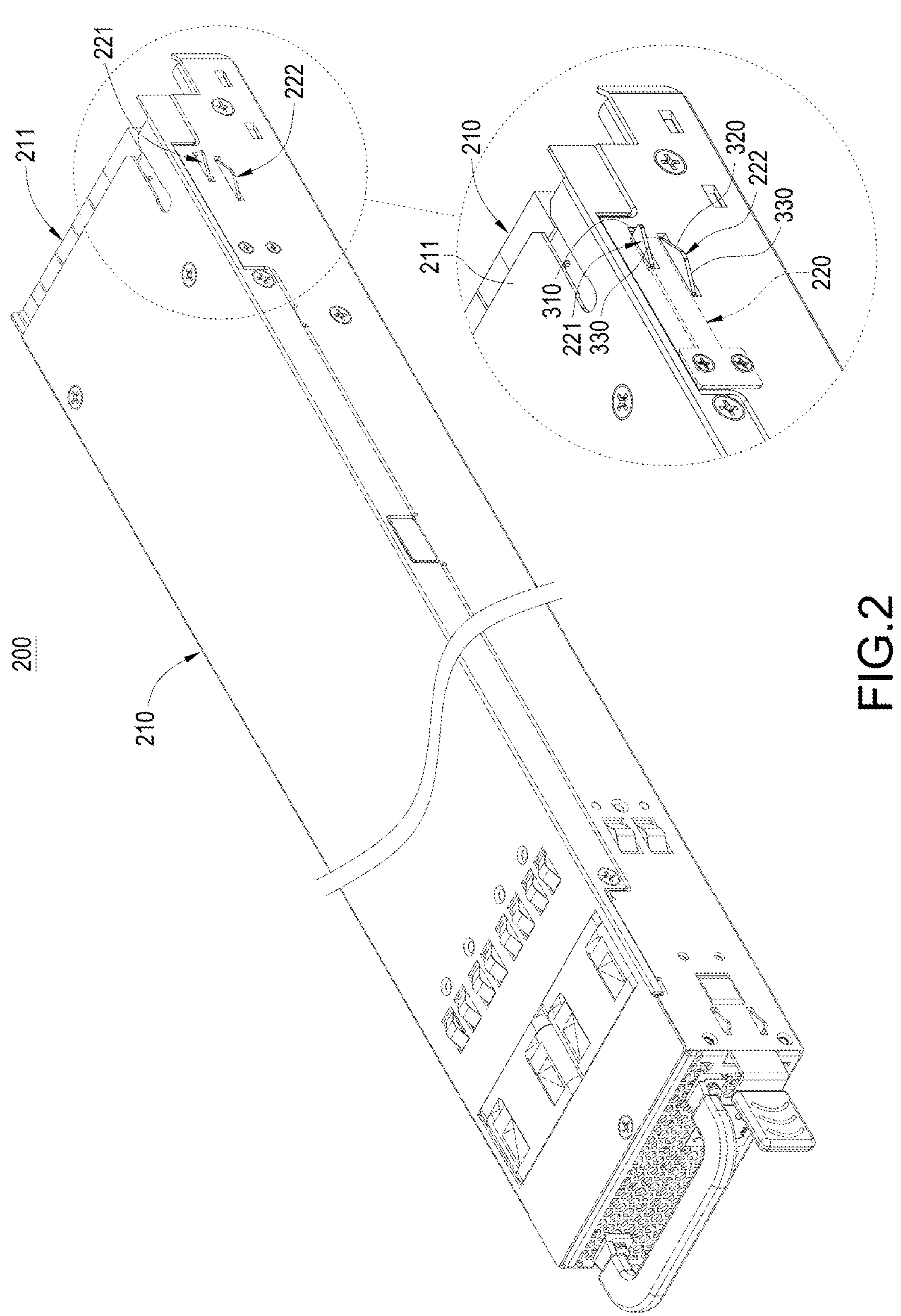
FIG. 2 is a perspective view showing the plug-in unit according to the first embodiment of this disclosure.

FIG. 2 is a perspective view showing the plug-in unit according to the first embodiment of this disclosure. According to FIG. 2, the plug-in unit 200 has a main body 210 and an elastic arm 220, the main body 210 is of an elongated shape, the main body 210 of the plug-in unit 200 is defined with a plug-in end 211 along a longitudinal direction thereof. When the plug-in unit 200 is plugged into the socket 101, the plug-in end 211 of the plug-in unit 200 passes the opening 1011 of the socket 101 and the plug-in unit 200 is then inserted into the socket 101. The elastic arm 220 is arranged at a side of the main body 210 of the plug-in unit 200, the elastic arm 220 has a first latch 221 and a second latch 222, the first latch 221 is defined with a stopping wall 310, the second latch 222 is defined with an actuating slope 320. The elastic arm 220 according to this embodiment has one end fixed with the main body 210, the elastic arm 220 is extended along the longitudinal direction of the main body 210 and the elastic arm 220 is extended along the plug-in direction 103. The first latch 221 and second latch 222 are arranged together at another end of the elastic arm 220.

According to this embodiment, the elastic arm 220 is disposed adjacent to the plug-in end 211 on the main body 210 of the plug-in unit 200, but the scope of this disclosure should not be limited to this. For example, the elastic arm 220 may be disposed at the front end 212 on the main body 210 of the plug-in unit 200 opposite to the plug-in end 211.

Figure 3:
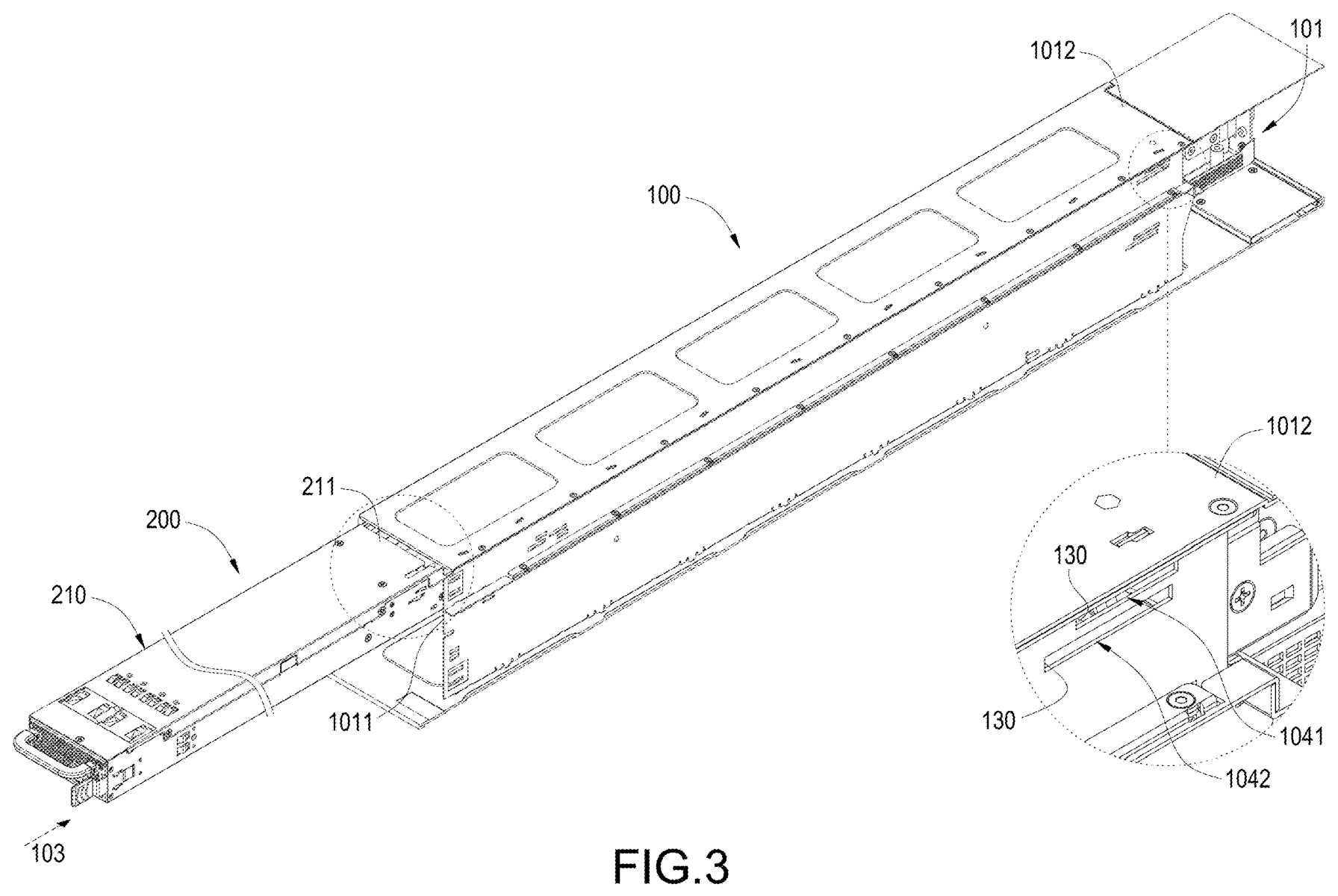
Figure 4:
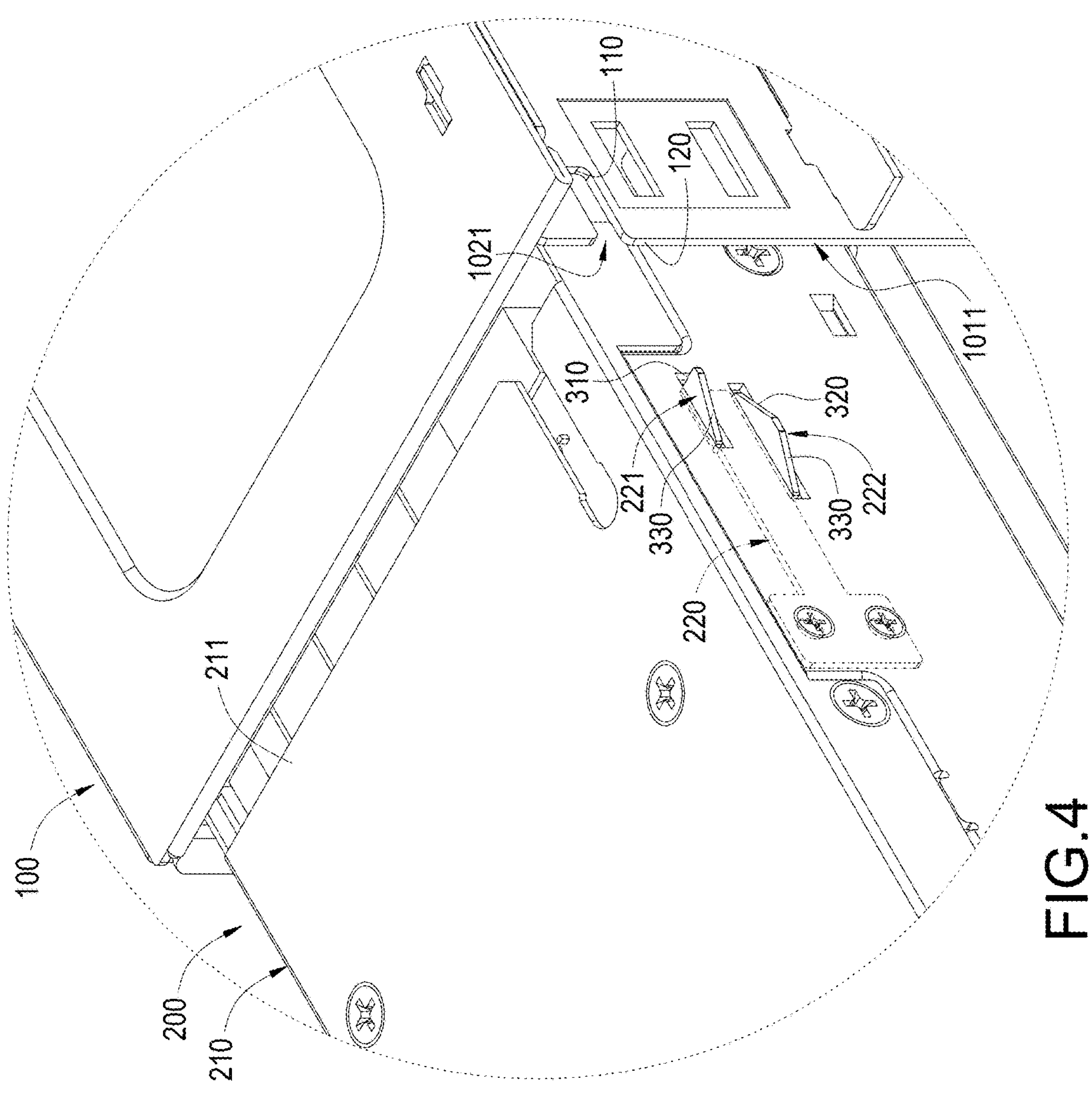
FIG. 4 is an enlarged view of the fool-proof structure for the shelf and the plug-in unit according to the first embodiment of this disclosure.

FIG. 3 is a perspective view showing the plug-in unit plugged in the shelf according to the first embodiment of this disclosure. FIG. 4 is an enlarged view of the fool-proof structure for the shelf and the plug-in unit according to the first embodiment of this disclosure. According to FIGS. 3 and 4, the first latch 221 and the second latch 222 are protruded from the main body 210 of the plug-in unit 200 for correspondingly interfering structures of the shelf 100. Specifically, the stopping wall 310 is disposed to be perpendicular to the plug-in direction 103 of the socket 101 and face the plug-in direction 103 of the socket 101 (here referring to a normal direction of the stopping wall 310 substantially disposed along the plug-in direction 103), the actuating slope 320 obliquely faces the plug-in direction 103 (here referring to a normal direction of the actuating slope 320 obliquely disposed along the plug-in direction 103). The interfering relationship with the shelf 100 of the first latch 221 and the second latch 222 are illustrated in the following paragraphs.

Figure 5:
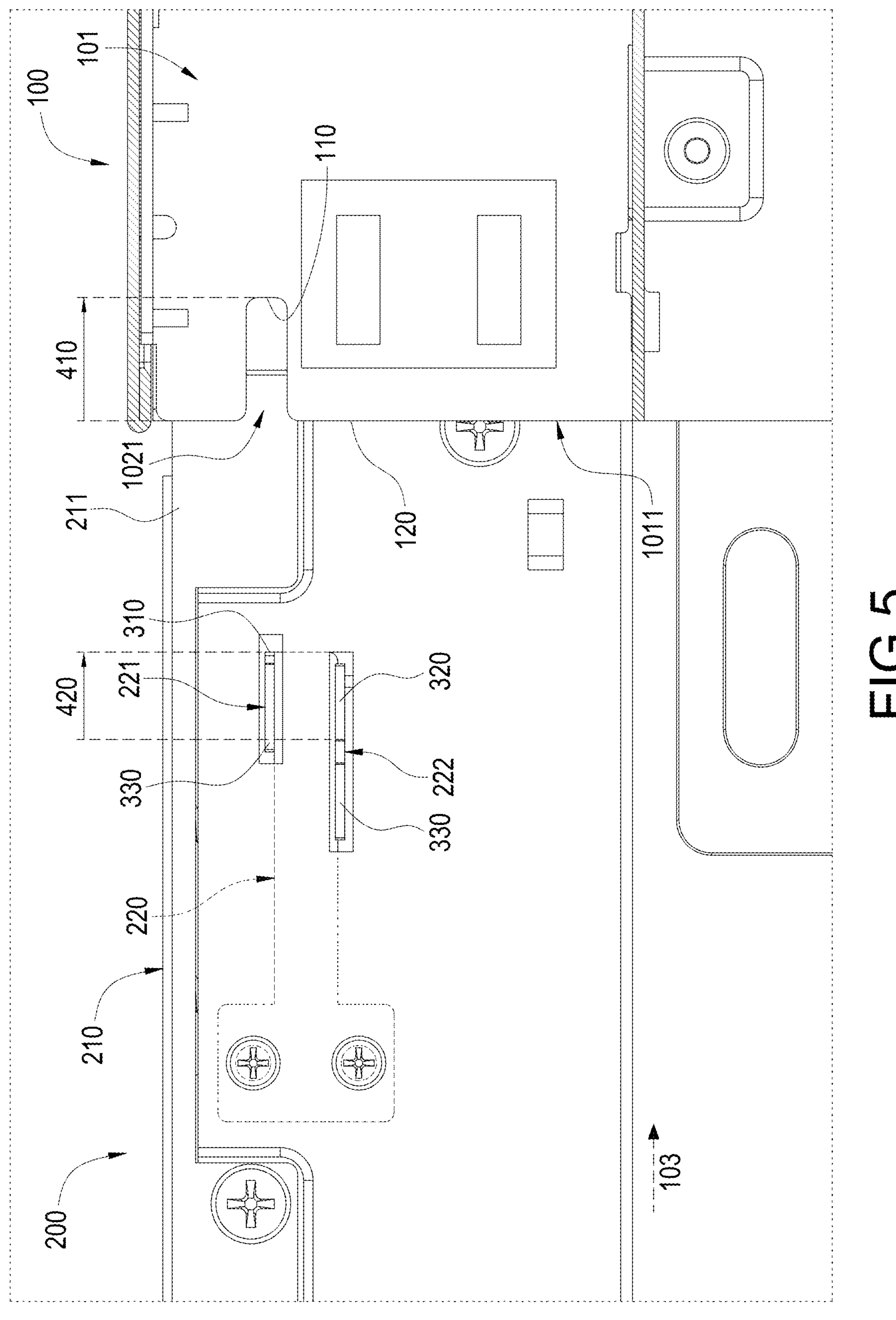
FIG. 5 is a normal view of the fool-proof structure for the shelf and the plug-in unit according to the first embodiment of this disclosure.

FIG. 5 is a normal view of the fool-proof structure for the shelf and the plug-in unit according to the first embodiment of this disclosure. According to this embodiment as shown in FIG. 5, a first pitch 410 is defined according to the plug-in direction 103 from the actuating portion 120 to the stopping portion 110, and a second pitch 420 is defined according to the plug-in direction 103 from the actuating slope 320 (here referring to a peak of the actuating slope 320 namely from a rear end of the actuating slope 320 along the plug-in direction 103) to the stopping wall 310, the first pitch 410 and the second pitch 420 are positive in a direction along the plug-in direction 103, and the first pitch 410 and the second pitch 420 are negative along a direction opposite to the plug-in direction 103.

Figure 6:
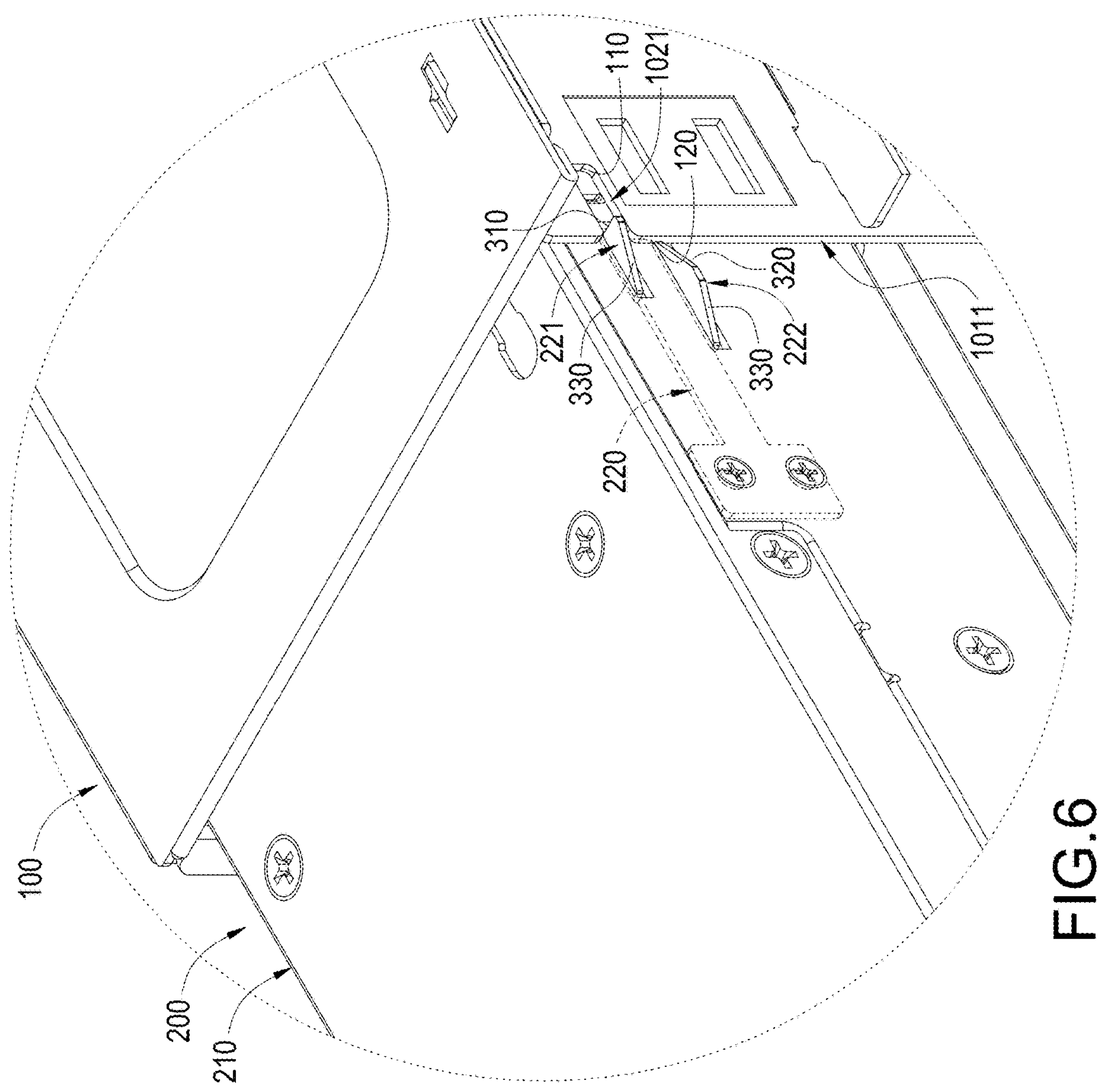
FIG. 6 is an enlarged view of the fool-proof structure for the shelf and the plug-in unit in operation according to the first embodiment of this disclosure.
Figure 7:
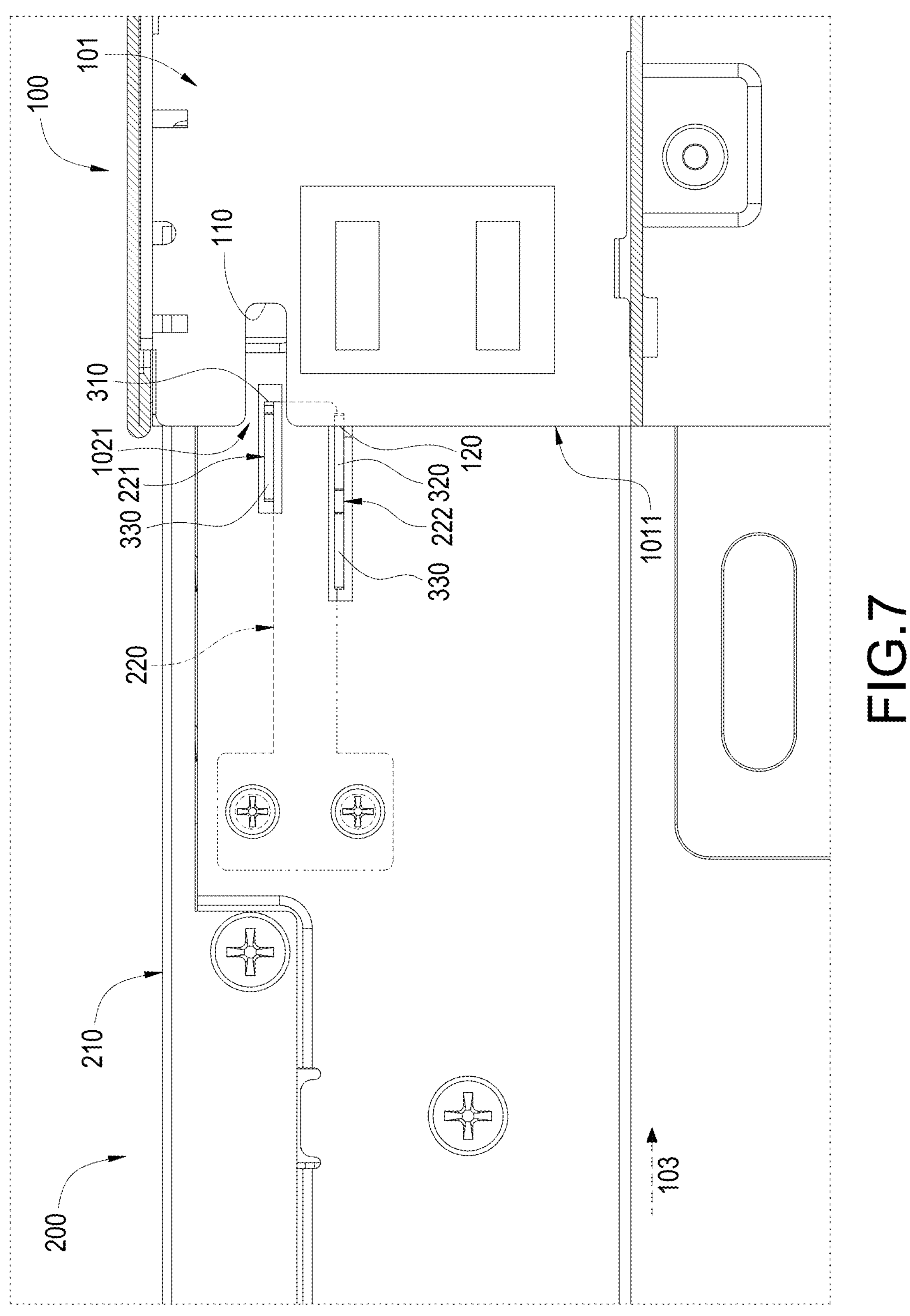
FIG. 7 is a normal view of the fool-proof structure for the shelf and the plug-in unit in operation according to the first embodiment of this disclosure.
Figure 8:
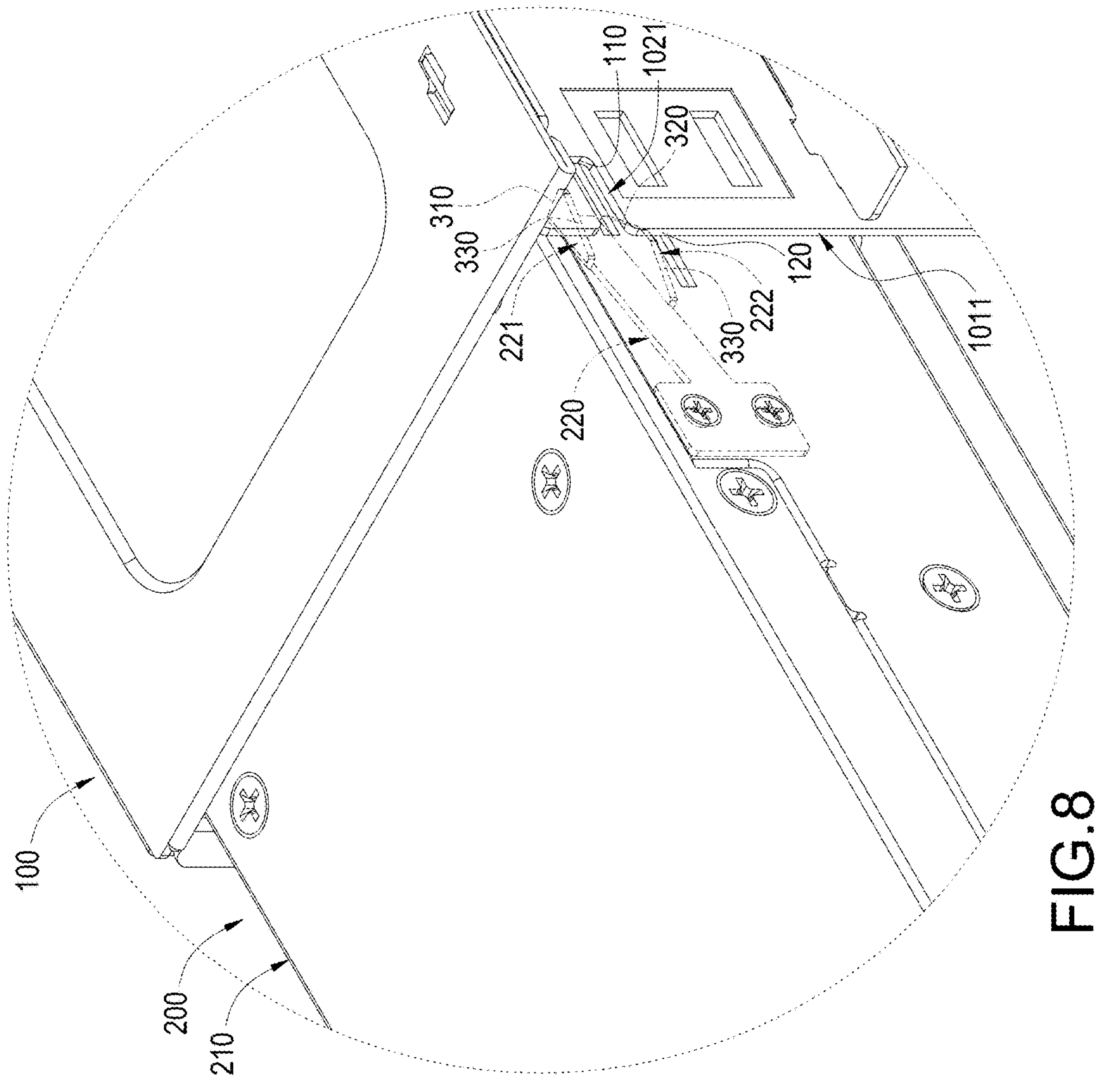
FIG. 8 is a perspective view showing a motion of an elastic arm of the fool-proof structure for the shelf and the plug-in unit according to the first embodiment of this disclosure.

FIG. 6 is an enlarged view of the fool-proof structure for the shelf and the plug-in unit in operation according to the first embodiment of this disclosure. FIG. 7 is a normal view of the fool-proof structure for the shelf and the plug-in unit in operation according to the first embodiment of this disclosure. FIG. 8 is a perspective view showing a motion of an elastic arm of the fool-proof structure for the shelf and the plug-in unit according to the first embodiment of this disclosure.

Referring to FIGS. 5 to 8, when the plug-in end 211 of the plug-in unit 200 is inserted into the socket 101 through the opening 1011, the first pitch 410 configured to be greater than or equal to the second pitch 420 allows the actuating portion 120 to press the actuating slope 320 to deflect the elastic arm 220 when (or before) the stopping wall 310 arrives the stopping portion 110.

Furthermore, both of the first latch 221 and the second latch 222 are retreated into the main body 210 of the plug-in unit 200 when the elastic arm 220 is deflected as mentioned above, namely the stopping wall 310*b* is retreated into the main body 210 of the plug-in unit 200 to bypass the stopping portion 110, and the plug-in unit 200 may be further pushed into the socket 101. Specifically, the stopping portion 110 may be defined on any partial structure of the shelf 100 which is used for abutting against the stopping wall 310, and the actuating portion 120 may be defined on any partial structure of the shelf 100 disposed corresponding to the actuating slope 320 for abutting against the actuating slope 320.

The fool-proof structure may not prevent the plug-in unit 200 from being plugged in the socket 101 which is incompatible, but it should prevent the plug-in unit 200 from coupling a power connect disposed in the bottom 1012 of a socket 101 which is incompatible.

Figure 9:
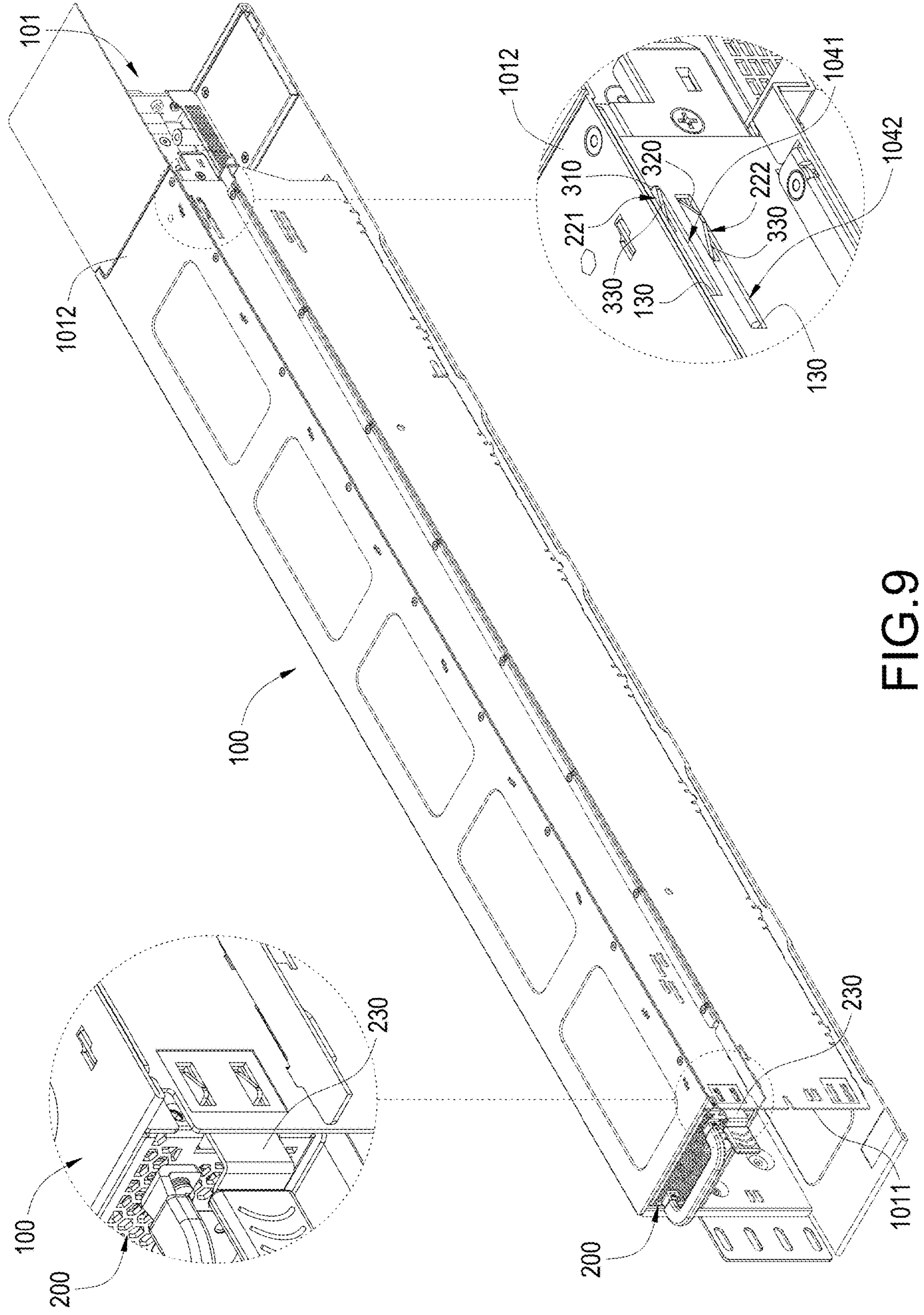
FIG. 9 is a perspective view showing the plug-in unit plugged in a socket according to the first embodiment of this disclosure.

FIG. 9 is a perspective view showing the plug-in unit plugged in a socket according to the first embodiment of this disclosure. According to FIG. 9, when the plug-in unit 200 is inserted in the socket 101 and positioned, the first latch 221 and the second latch 222 respectively latch buckling holes 1041, 1042 at the bottom 1012 of the socket 101 to position the plug-in unit 200 in the socket 101.

A releasing portion 130 is disposed at the internal surface of the socket 101, the elastic arm 220 has at least a releasing slope 330, and the releasing slope 330 obliquely face a direction opposite to the plug-in direction 103 (here referring to a normal direction of the releasing slope 330 obliquely disposed a direction opposite to the plug-in direction 103). The releasing portion 130 may be any partial structure of the shelf 100 disposed corresponding to the releasing slope 330 for abutting against the releasing slope 330. When the plug-in unit 200 is retreated from the socket 101 along a direction opposite to the plug-in direction 103, the releasing portion 130 may press the releasing slope 330 to deflect the elastic arm 220. According to this embodiment, the elastic arm 220 has two releasing portions 130 and two releasing slopes 330, the stopping wall 310 and one of the releasing slopes 330 are arranged together on the first latch 221, and the actuating slope 320 and another of the releasing slopes 330 are arranged together on the second latch. A plurality of releasing portions 130 corresponding to the releasing slopes 330 are respectively defined at internal edged of the buckling holes 1041, 1042.

Moreover, a locker latch 230 may be arranged at the front end 212 on the main body 210 of the plug-in unit 200, the plug-in unit 200 may be locked by the locker latch 230 latching the internal surface of the socket 101 when inserted in the socket 101 and positioned. The locker latch 230 has one end fixed with the main body 210 of the plug-in unit 200 and the locker latch 230 has another end protruded from the front end 212 on the main body 210 of the plug-in unit 200 for an unlock operation to the locker latch 230 by a user.

Figure 10:
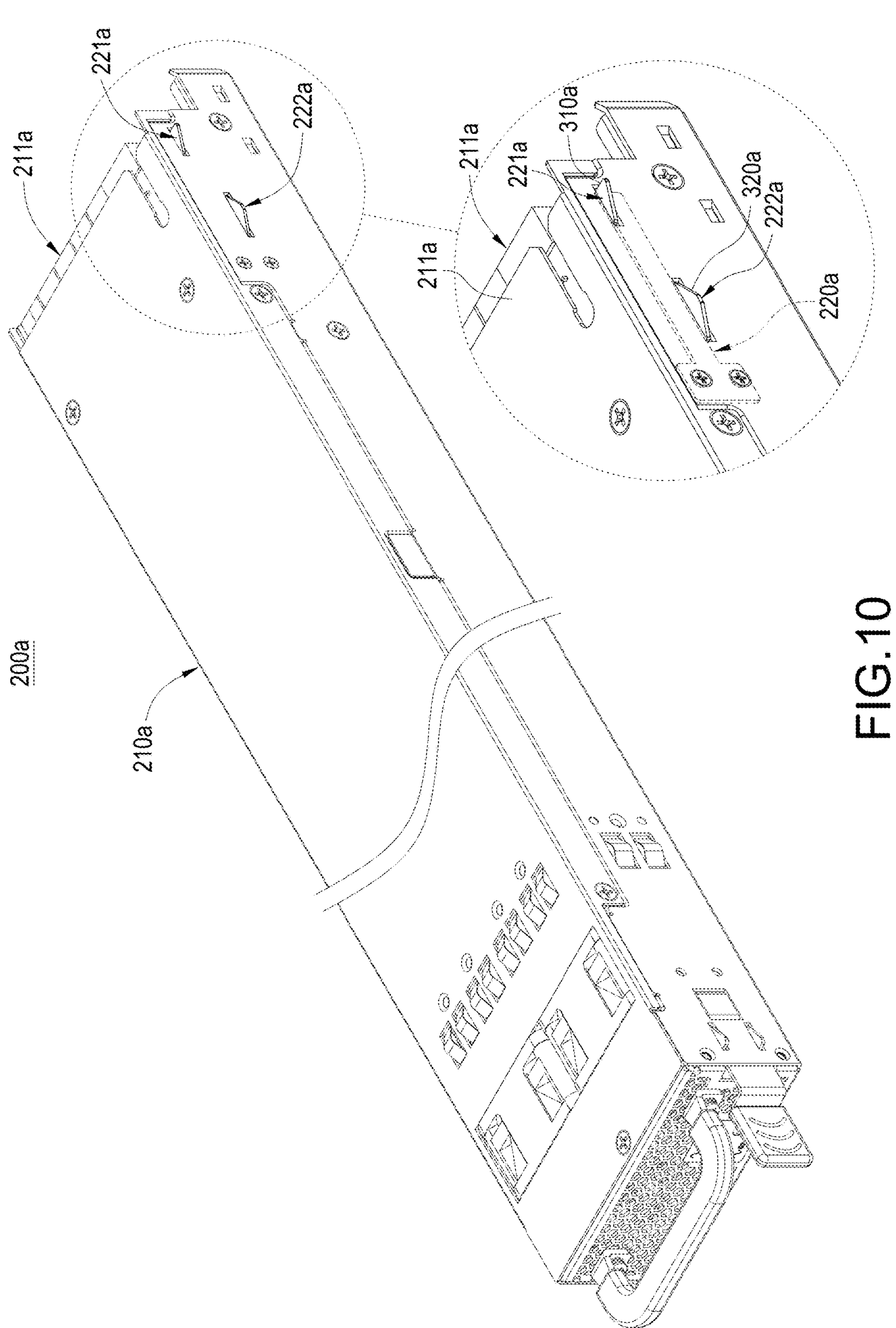
FIG. 10 is a perspective view showing a plug-in unit according to the second embodiment of this disclosure.
Figure 11:
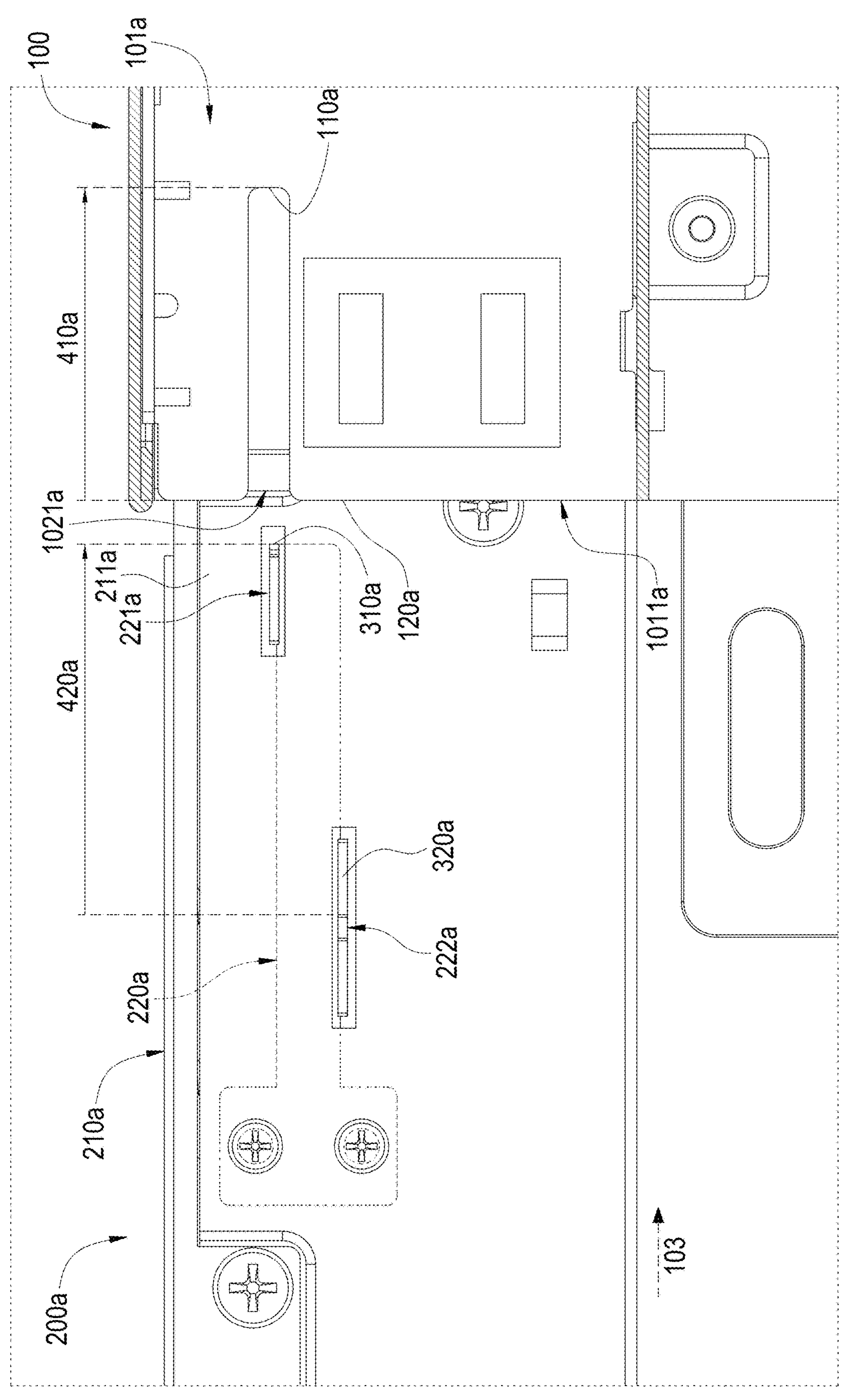
FIG. 11 is a normal view of a fool-proof structure for a shelf and a plug-in unit according to the second embodiment of this disclosure.
Figure 12:
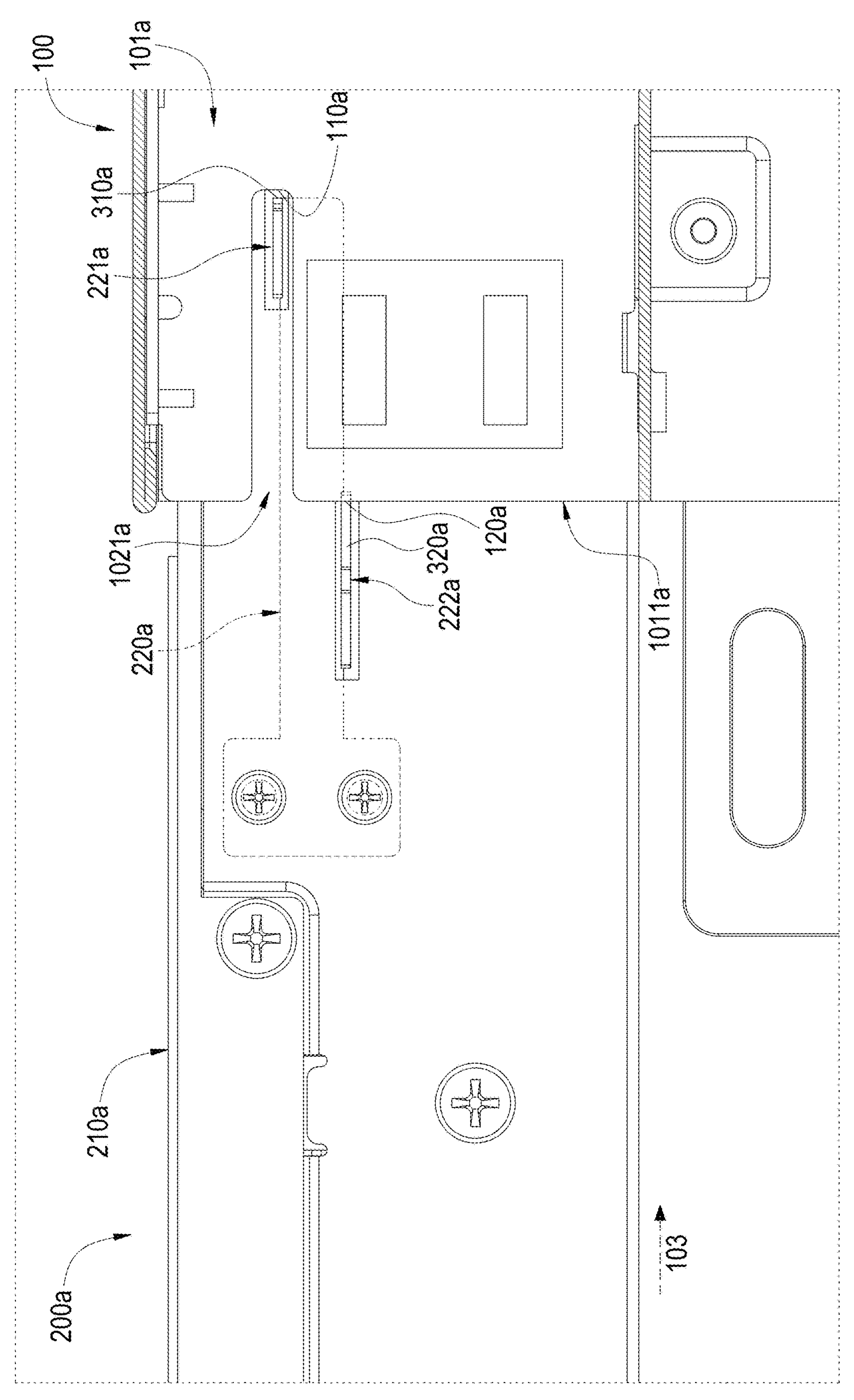
FIG. 12 is a normal view of the fool-proof structure for the shelf and the plug-in unit in operation according to the second embodiment of this disclosure.

FIG. 10 is a perspective view showing a plug-in unit according to the second embodiment of this disclosure. FIG. 11 is a normal view of a fool-proof structure for a shelf and a plug-in unit according to the second embodiment of this disclosure. FIG. 12 is a normal view of the fool-proof structure for the shelf and the plug-in unit in operation according to the second embodiment of this disclosure.

Referring to the fool-proof structure of the shelf and the plug-in unit according to the second embodiment of this disclosure as shown in FIGS. 10 to 12, another socket 101*a* of the shelf 100 and another corresponding plug-in unit 200*a* are taken as an example as illustrated in the following paragraphs. The socket 101*a* has an opening 1011*a* at one end thereof. A stopping portion 110*a* and an actuating portion 120*a* are arranged on an internal surface of the socket 101*a*, and the stopping portion 110*a* and the actuating portion 120*a* are respectively communicated with the opening 1011*a*. The aforementioned "communicated with the opening 1011*a*" means that no obstruction exists in an area between the stopping portion 110*a* (or the actuating portion 120*a*) and the opening 1011*a* along the plug-in direction 103. According to this embodiment, a first path 1021*a* is provided on the internal surface of the socket 101*a*. The first path 1021*a* is extended parallel to the plug-in direction 103 from the opening 1011*a* to the stopping portion 110*a*. The actuating portion 120*a* is arranged at the opening 1011*a*. According to this embodiment the stopping portion 110*a* is disposed at a position different from the first embodiment.

The plug-in unit 200*a* has a main body 210*a* and an elastic arm 220*a*, the main body 210*a* is of an elongated shape, the main body 210*a* of the plug-in unit 200*a* is defined with a plug-in end 211*a* along a longitudinal direction thereof. When the plug-in unit 200*a* is plugged into the socket 101*a*, the plug-in end 211*a* of the plug-in unit 200*a* passes the opening 1011*a* of the socket 101*a* and the plug-in unit 200*a* is then inserted into the socket 101*a*. The elastic arm 220*a* is arranged at a side of the main body 210*a* of the plug-in unit 200*a*, the elastic arm 220*a* has a first latch 221*a* and a second latch 222*a*, the first latch 221*a* is defined with a stopping wall 310*a*, the second latch 222 is defined with an actuating slope 320*a*. The elastic arm 220*a* according to this embodiment has one end fixed with the main body 210*a*, the elastic arm 220*a* is extended along the longitudinal direction of the main body 210*a* and the elastic arm 220*a* is extended along the plug-in direction 103. The first latch 221*a* and second latch 222*a* are arranged together at another end of the elastic arm 220*a*.

The elastic arm 220*a* according to this embodiment has one end fixed with the main body 210*a*, the elastic arm 220*a* is extended according to the plug-in direction 103 and the elastic arm 220*a* is extended along the plug-in direction 103. The first latch 221*a* and second latch 222*a* are arranged together at another end of the elastic arm 220*a*, the first latch 221*a* and the second latch 222*a* are protruded from the main body 210*a* of the plug-in unit 200*a* for correspondingly interfering structures of the shelf 100. Specifically, the stopping wall 310*a* is disposed to be perpendicular the plug-in direction 103 of the socket 101*a* and face the plug-in direction 103 of the socket 101*a* (here referring to a normal direction of the stopping wall 310*a* substantially disposed along the plug-in direction 103), the actuating slope 320*a* is disposed to obliquely face the plug-in direction 103 (here referring to a normal direction of the actuating slope 320*a* obliquely disposed along the plug-in direction 103). According to this embodiment the actuating slope 320*a* is disposed at a position different from the first embodiment. The interfering relationship with the shelf 100 of the first latch 221*a* and the second latch 222*a* are illustrated in the following paragraphs.

According to this embodiment, a first pitch 410*a* is defined according to the plug-in direction 103 from the actuating portion 120*a* to the stopping portion 110*a*, and a second pitch 420*a* is defined according to the plug-in direction 103 from the actuating slope 320*a* (here referring to a peak of the actuating slope 320*a* namely from a rear end of the actuating slope 320*a* along the plug-in direction 103) to the stopping wall 310*a*, the first pitch 410*a* and the second pitch 420*a* are positive in a direction along the plug-in direction 103, and the first pitch 410*a* and the second pitch 420*a* are negative along a direction opposite to the plug-in direction 103.

Figure 13:
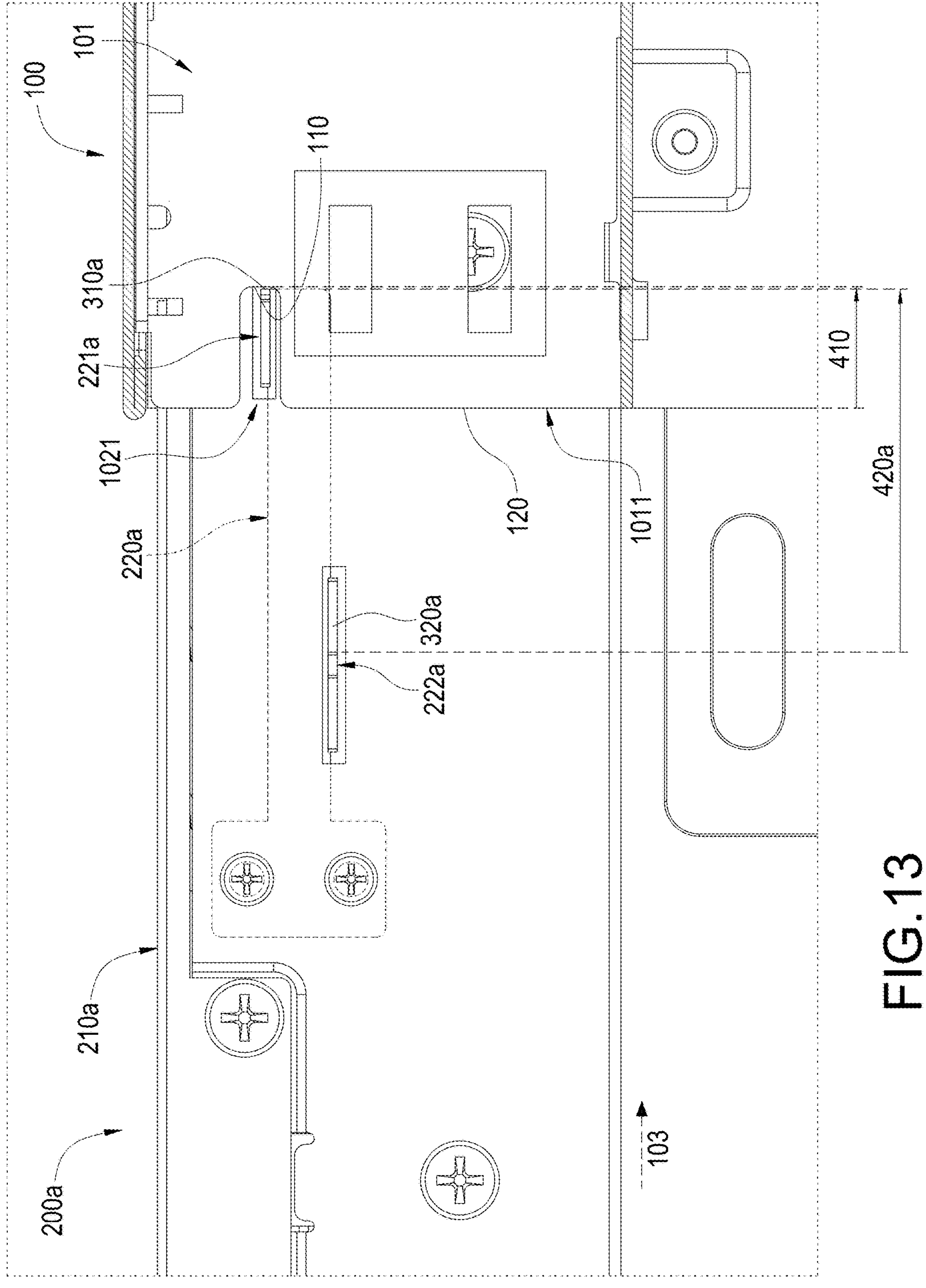
FIG. 13 is a normal view of a fool-proof structure for a shelf and a plug-in unit in operation according to the third embodiment of this disclosure.

FIG. 13 is a normal view of a fool-proof structure for a shelf and a plug-in unit in operation according to the third embodiment of this disclosure. In the third embodiment of this disclosure as shown in FIG. 13, the plug-in unit 200*a* same as that mentioned in the second embodiment is inserted into the socket 101 same as that mentioned in the first embodiment. The first pitch 410*a* mentioned in this embodiment is less than the first pitch 410 mentioned in the first embodiment, and the second pitch 420*a* mentioned in this embodiment is greater than or equal to the second pitch 420 mentioned in the first embodiment. However, the first pitch 410*a* is less than the second pitch 420*a* in this embodiment. Accordingly, the stopping wall 310 abuts against the stopping portion 110 at a time when the actuating slope 320 arrives the actuating portion 120 or earlier than the time to stop the plug-in unit 200 from further moving into the socket 101, so that the plug-in unit 200*a* of this embodiment cannot be plugged in the socket 101 which is incompatible.

Figure 14:
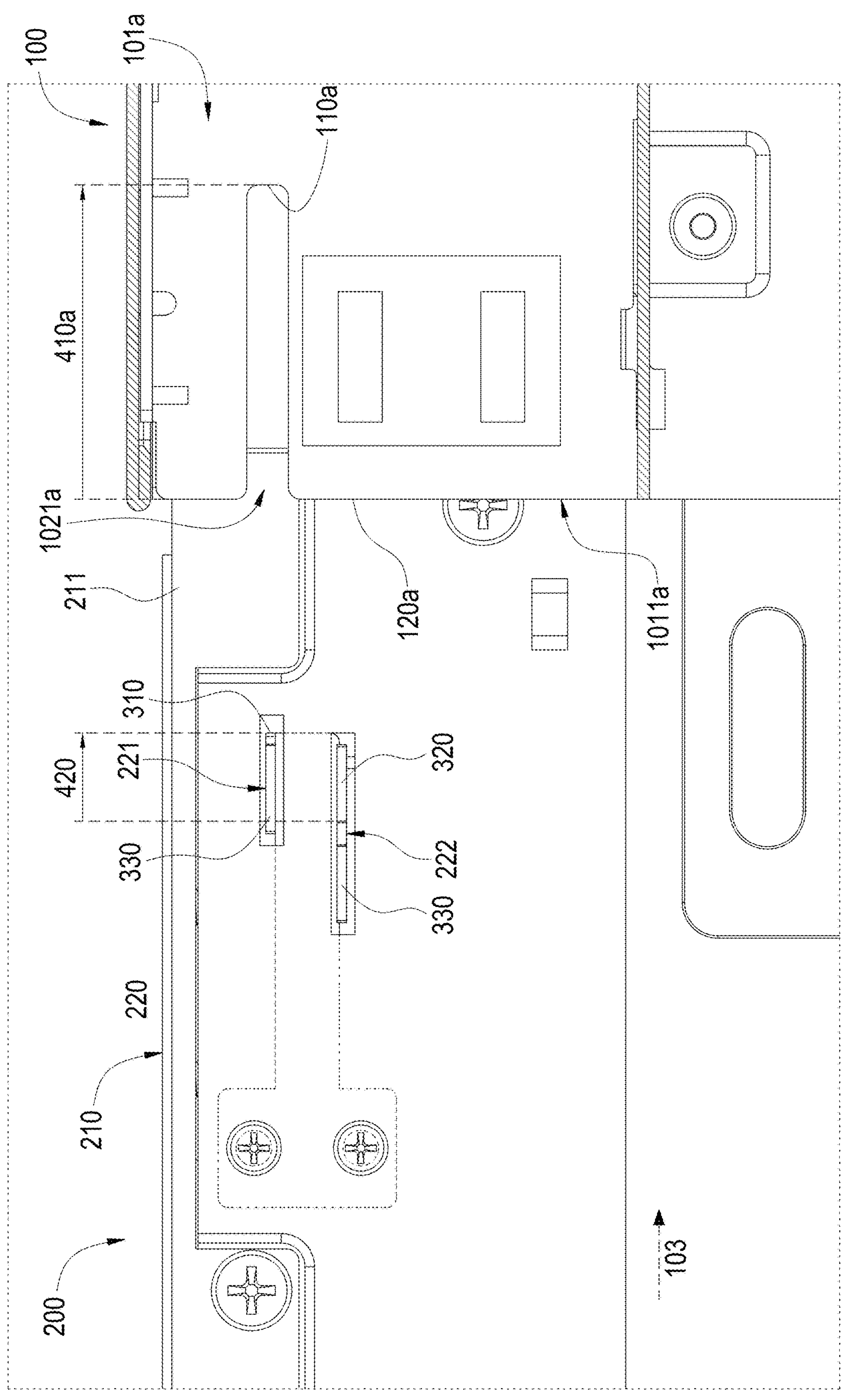
FIG. 14 is a normal view of a fool-proof structure for a shelf and a plug-in unit in operation according to the fourth embodiment of this disclosure.

FIG. 14 is a normal view of a fool-proof structure for a shelf and a plug-in unit in operation according to the fourth embodiment of this disclosure. In the fourth embodiment of this disclosure as shown in FIG. 14, the plug-in unit 200 same as that mentioned in the first embodiment is inserted into the socket 101*a* same as that mentioned in the second embodiment. The first pitch 410*a* mentioned in this embodiment is greater than or equal to the first pitch 410 mentioned in the first embodiment, and the second pitch 420 mentioned in this embodiment is less than the second pitch 420*a* mentioned in the second embodiment. However, the first pitch 410*a* is greater than or equal to the second pitch 420 in this embodiment. In a plug-in process, the actuating portion 120*a* may press the actuating slope 320 to deflect the elastic arm 220 when (or before) the stopping wall 310 arrives the stopping portion 110*a*. Accordingly, the socket 101*a* mentioned in the second embodiment and the fourth embodiment as shown in FIGS. 11 and 14 is compatible with various performances of the plug-in units 200, 200*a*. Therefore, the socket 101*a* of this embodiment not only correspondingly allows an insertion of the plug-in unit 200*a*, but also is compatible an insertion of another plug-in module 200 having a configuration that the first pitch 410*a* is greater than or equal to the second pitch 420. In other words, as shown in FIGS. 5 and 11, the power connectors in a plurality of sockets 101, 101*a* respectively supply power to various load voltages, and the sockets 101, 101*a* may be disposed with various first pitches 410, 410*a* respectively. Specifically, the larger first pitch 410*a* is disposed corresponding to the higher the load voltage. The plug-in units 200, 200*a* are respectively suitable for various operating voltages. However, as shown in FIGS. 11 and 13, one of the plug-in units 200*a* may be disposed with a second pitch 420 only less than the first pitch 410*a* of some of the sockets 101*a*, thereby excluding another of the sockets 101 with load voltage exceeds its operating voltage.

Accordingly, in this embodiment, the fool-proof structure may have a plug-in unit 200 as shown in FIG. 5 and another plug-in unit 200*a* as shown in FIG. 11. Moreover, as shown in FIGS. 12 and 14, two of the plug-in units 200, 200*a* are compatible with the same socket 101*a*.

One of the plug-in units 200 has an elastic arm 220, a stopping wall 310 and an actuating slope 320, and a second pitch 420 is defined from the actuating slope 320 to the stopping wall 310 along the plug-in direction, the second pitch 420 thereof is less than the first pitch 410*a*, and this plug-in unit 200 may be plugged in the socket 101*a*. When this plug-in unit 200 is inserted into the socket 101*a*, the actuating portion 120*a* presses the actuating slope 320 to deflect the elastic arm 220 when (or before) the stopping wall 310 arrives the stopping portion 110*a*, so that the stopping wall 310 is retreated into the plug-in unit 200 to bypass the stopping portion 110*a*.

Another of the plug-in units 200*a* is defined with another second pitch 420*a*. Specifically, the plug-in unit 200*a* has another elastic arm 220*a*, another stopping wall 310*a* and another actuating slope 320*a*, another second pitch 420*a* is defined from the actuating slope 320*a* to the stopping wall 310*a* along the plug-in direction, the second pitch 420*a* is different from the second pitch and less than the first pitch 410*a*, and the plug-in unit 200*a* may be plugged in the socket 101*a*. When the plug-in unit 200*a* is plugged into the socket 101*a*, the actuating portion 120 presses the actuating slope 320*a* to deflect the elastic arm 220*a* when (or before) the stopping wall 310*a* arrives the stopping portion 110*a* so that the stopping wall 310*a* is retreated into the plug-in unit 200*a* to bypass the stopping portion 110*a*.

The aforementioned arrangement may have one socket 101 with a lower load voltage and another socket 101*a* with a higher load voltage. Moreover, the plug-in unit 200 with a lower operating voltage is configured corresponding to the socket 101 with lower load voltage, and another plug-in unit 200*a* with a higher operating voltage is configured corresponding to the socket 101*a* with higher load voltage. The socket 101*a* with higher load voltage is compatible with the plug-in unit 200*a* with corresponding performance and is downwardly compatible with other plug-in unit 200 with a lower performance. The plug-in unit 200*a* with a higher performance cannot be inserted in the socket 101 with a corresponding or higher performance. This may prevent devices from power overloading. However, the scope of this disclosure should not be limited to the performance mentioned, and may also be applied to other performances, such as signal transmission speed.

In summary, the fool-proof structure of the shelf and the plug-in unit according to this disclosure may be adjusted by configuring the first pitch 410*a* and the second pitch 420, 420*a* to allow one arrangement of the stopping portion 110*a* and the actuating portion 120*a* to be compatible with some of a plurality of plug-in units 200, 200*a* with different performances.

Figure 15:
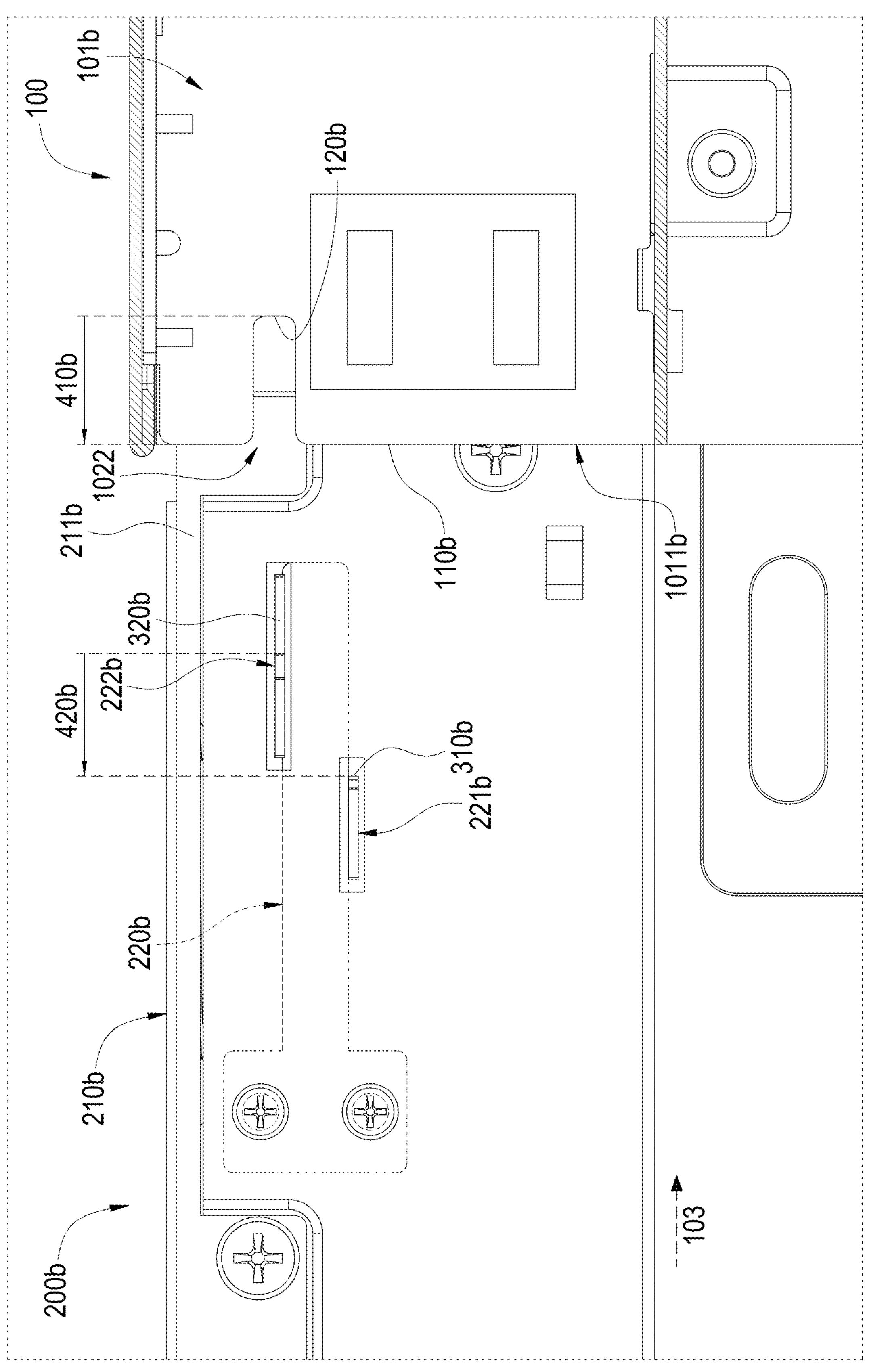
FIG. 15 is a normal view of a fool-proof structure for a shelf and a plug-in unit in operation according to the fifth embodiment of this disclosure.

FIG. 15 is a normal view of a fool-proof structure for a shelf and a plug-in unit in operation according to the fifth embodiment of this disclosure. Referring to the fool-proof structure of the shelf and the plug-in unit according to the fifth embodiment of the present disclosure as shown in FIG. 15, an example in this embodiment further provides another socket 101*b* of the shelf 100 and correspondingly another plug-in unit 200*b* which are illustrated in the following paragraphs.

In this embodiment, the socket 101*b* has an opening 1011*b* at one end thereof. A stopping portion 110*b* and an actuating portion 120*b* are arranged on an internal surface of the socket 101*b*, and the stopping portion 110*b* and the actuating portion 120*b* are respectively communicated with the opening 1011*b*. The aforementioned "communicated with the opening 1011*b*" means that no obstruction exists in an area between the stopping portion 110*b* (or the actuating portion 120*b*) and the opening 1011*b* along the plug-in direction 103.

According to this embodiment, the stopping portion 110*b* is disposed at the opening 1011*b*. A second path 1022*b* is provided on an internal surface of the socket 101*b*. The second path 1022*b* is extended parallel to the plug-in direction 103 from the opening 1011*b* to the actuating portion 120*b*.

The plug-in unit 200*b* has a main body 210*b* and an elastic arm 220*b*, the main body 210*b* is of an elongated shape, the main body 210*b* of the plug-in unit 200*b* is defined with a plug-in end 211*b* along a longitudinal direction thereof. When the plug-in unit 200*b* is plugged into the socket 101*b*, the plug-in end 211*b* of the plug-in unit 200*b* passes the opening 1011*b* of the socket 101*b* and the plug-in unit 200*b* is then inserted into the socket 101*b*. The elastic arm 220*b* is arranged at a side of the main body 210*b* of the plug-in unit 200*b*, the elastic arm 220*b* has a first latch 221*b* and a second latch 222*b*, the first latch 221*b* is defined with a stopping wall 310*b*, the second latch 222 is defined with an actuating slope 320*b*. The elastic arm 220*b* according to this embodiment has one end fixed with the main body 210*b*, the elastic arm 220*b* is extended according to the plug-in direction 103 and the elastic arm 220*b* is extended along the plug-in direction 103. The first latch 221*b* and second latch 222*b* are arranged together at another end of the elastic arm 220*b*.

The first latch 221*b* and the second latch 222*b* are protruded from the main body 210*b* of the plug-in unit 200*b* for correspondingly interfering structures of the shelf 100. Specifically, the stopping wall 310*b* is disposed to be perpendicular to the plug-in direction 103 of the socket 101*b* and face the plug-in direction 103 of the socket 101*a* (here referring to a normal direction of the stopping wall 310*b* disposed along the plug-in direction 103), the actuating slope 320*b* obliquely faces the plug-in direction 103 (here referring to a normal direction of the actuating slope 320*b* obliquely disposed along the plug-in direction 103). The interfering relationship with the shelf 100 of the first latch 221*b* and the second latch 222*b* are illustrated in the following paragraphs.

According to this embodiment a first pitch 410*b* is defined according to the plug-in direction 103 from the actuating portion 120*b* to the stopping portion 110*b*, and a second pitch 420*b* is defined according to the plug-in direction 103 from the actuating slope 320*b* (here referring to a peak of the actuating slope 320*b* namely from a rear end of the actuating slope 320*b* along the plug-in direction 103) to the stopping wall 310*b*, the first pitch 410*b* and the second pitch 420*b* are positive in a direction along the plug-in direction 103, and the first pitch 410*b* and the second pitch 420*b* are negative along a direction opposite to the plug-in direction 103.

When the plug-in end 211*b* of the plug-in unit 200*b* is inserted into the socket 101*b* through the opening 1011*b*, the first pitch 410*b* configured to be greater than or equal to the second pitch 420*b* allows the actuating portion 120*b* to press the actuating slope 320*b* to deflect the elastic arm 220*b* when (or before) the stopping wall 310*b* arrives the stopping portion 110*b*. Furthermore, both of the first latch 221*b* and the second latch 222*b* are retreated into the main body 210*b* of the plug-in unit 200*b* when the elastic arm 220*b* is deflected as mentioned above, namely the stopping wall 310*b* is retreated into the main body 210*b* of the plug-in unit 200*b* to bypass the stopping portion 110*b*, and the plug-in unit 200*b* may be further pushed into the socket 101*b*. Specifically, the stopping portion 110*b* may be defined on any partial structure of the shelf 100*b* stopping wall 310*b* which is used for abutting against the stopping wall 310*b*, and the actuating portion 120*b* may be defined on any partial structure of the shelf 100 disposed corresponding to the actuating slope 320*b* for abutting against the actuating slope 320*b*.

In this embodiment, when the plug-in unit 200*b* is correspondingly inserted into the socket 101*b* along the plug-in direction 103, although the plug-in unit 200*b* firstly passes through the stopping portion 110*b* overall, both of the first pitch 410*b* and the second pitch 420*b* according to this embodiment are opposite to the plug-in direction 103 and therefore negative, and the first pitch 410*b* is still greater than or equal to the second pitch 420*b*. During the insertion process, the actuating portion 120*b* presses the actuating slope 320*b* to deflect the elastic arm 220*b* when (or before) the stopping wall 310*b* arrives the stopping portion 110*b*.

Figure 16:
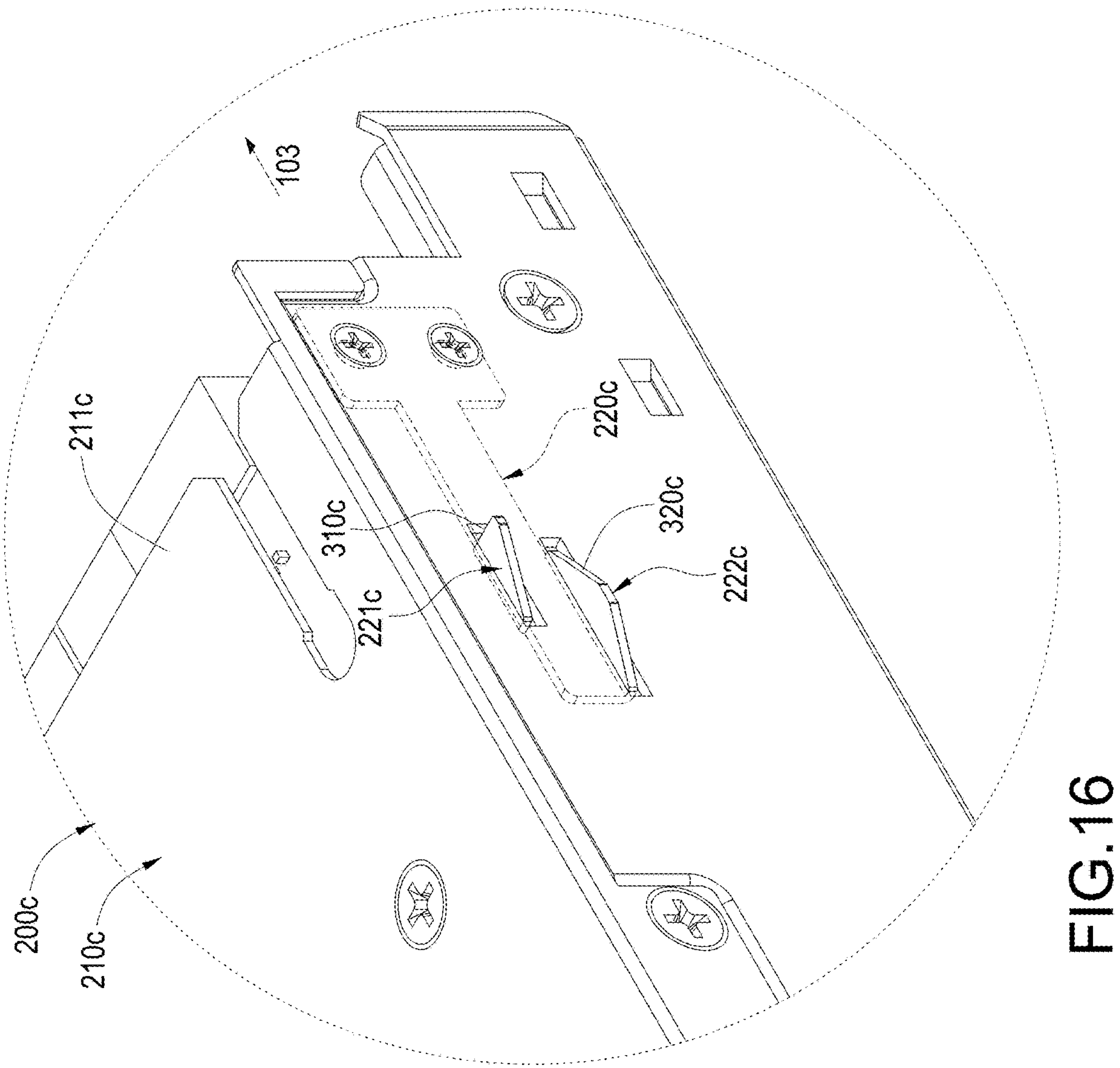
FIG. 16 is a partial enlarged perspective view of a fool-proof structure for a shelf and a plug-in unit in operation according to the sixth embodiment of this disclosure.

FIG. 16 is a partial enlarged perspective view of a fool-proof structure for a shelf and a plug-in unit in operation according to the sixth embodiment of this disclosure. Referring to FIG. 16, the sixth embodiment of this disclosure provides another plug-in unit 200*c* different from the previous embodiments which has a main body 210*c*. The structure of the plug-in unit 200*c* according to this embodiment is roughly the same as that mentioned in the first embodiment. This embodiment is different from the previous examples in that the elastic arm 220*c* has one end fixed with the main body 210, and the elastic arm 220*c* is extend along the longitudinal direction of the plug-in unit 200*c* and the elastic arm 220*c* is extended along a direction opposite to the plug-in direction 103. A stopping wall 310*c* and an actuating slope 320 are arranged at another end of the elastic arm 220*c*. In this embodiment, the relative position between the first latch 221*c* and the second latch 222*c* are disposed same as the first latch 221 and the second latch 222 mentioned in the first embodiment, so that the plug-in unit 200*c* according to this embodiment is compatible with the socket 101 mentioned in the first embodiment. This configuration has the first latch 221*c* and the second latch 222*c* disposed farther from an end surface of the plug-in end 211*c*. Accordingly, the first latch 221*c* and the second latch 222*c* may not be aligned when the plug-in unit 200*c* is inserted, so that it is easier to insert the plug-in unit 200*c* into the opening 1011 of the socket 101.

In conclusion, various elastic arms may be configured to define various sockets compatible with the plug-in unit for insertion. The fool-proof structure according to the disclosure is therefore easy to be adjusted according to various operation requirements. Moreover, a larger space is provided along the longitudinal directions of the socket and the plug-in unit than on an edge of the opening, and this allows to arrange more first pitches and more second pitches corresponding to various performances.

While this disclosure has been described by means of specific embodiments, numerous modifications and variations could be made thereto by those skilled in the art without departing from the scope and spirit of this disclosure set forth in the claims.

What is claimed is:

1. A cabinet assembly, comprising:

a cabinet;

a shelf disposed in the cabinet and comprising a socket defining an opening;

a stopping portion and an actuating portion arranged on an internal surface of the socket and respectively communicated with the opening; and a first plug-in unit and a second plug-in unit each configured to be inserted into the socket along a plug-in direction from the opening toward an interior of the socket, wherein each of the first plug-in unit and the second plug-in unit comprises:

a main body; and an elastic arm arranged on one side of the main body, the elastic arm having a stopping wall configured to face the plug-in direction and an actuating slope configured to obliquely face the plug-in direction;

wherein a first pitch is defined along the plug-in direction from the actuating portion to the stopping portion;

wherein, for each of the first plug-in unit and the second plug-in unit, a respective second pitch is defined along the plug-in direction from the actuating slope to the stopping wall;

wherein the second pitch of the first plug-in unit is different from the second pitch of the second plug-in unit; and wherein the first pitch is greater than or equal to the respective second pitch of each of the first plug-in unit and the second plug-in unit, such that during insertion of a corresponding plug-in unit into the socket, contact between the actuating slope and the actuating portion causes the elastic arm to deflect before the stopping wall reaches the stopping portion.

2. The cabinet assembly of claim 1, wherein the second pitch of the first plug-in unit is smaller than the second pitch of the second plug-in unit.

3. The cabinet assembly of claim 1, further comprising a third plug-in unit having a third pitch defined along the plug-in direction from an actuating slope to a stopping wall of an elastic arm thereof, wherein the third pitch is greater than the first pitch, such that the third plug-in unit is prevented from being fully inserted into the socket by engagement between the stopping wall and the stopping portion.

4. The cabinet assembly of claim 1, wherein the elastic arm has one end fixed to the main body of the corresponding plug-in unit.

5. The cabinet assembly of claim 1, wherein the elastic arm extends from a fixed end attached to the main body in a direction opposite to the plug-in direction and remains entirely on a single lateral side of the main body throughout elastic deflection.

6. The cabinet assembly of claim 1, wherein the socket further comprises a releasing portion arranged on the internal surface, and the elastic arm further comprises a releasing slope configured to be pressed by the releasing portion when the plug-in unit is moved along a direction opposite to the plug-in direction.

7. A shelf configured to be disposed in a cabinet and to receive a plug-in unit, comprising:

a socket defining an opening;

a stopping portion and an actuating portion arranged on an internal surface of the socket and respectively communicated with the opening;

wherein a plug-in direction is defined from the opening toward an interior of the socket;

wherein a first pitch is defined along the plug-in direction from the actuating portion to the stopping portion;

wherein the shelf is configured to receive a first plug-in unit and a second plug-in unit that are different from each other, each of the first plug-in unit and the second plug-in unit comprising an elastic arm having a stopping wall configured to face the plug-in direction and an actuating slope configured to obliquely face the plug-in direction;

wherein, for each of the first plug-in unit and the second plug-in unit, a respective second pitch is defined along the plug-in direction from the actuating slope to the stopping wall;

wherein the second pitch of the first plug-in unit is different from the second pitch of the second plug-in unit; and wherein the first pitch is greater than or equal to the respective second pitch of each of the first plug-in unit and the second plug-in unit.

8. The shelf of claim 7, wherein the second pitch of the first plug-in unit is smaller than the second pitch of the second plug-in unit.

9. The shelf of claim 7, wherein the shelf is further configured to prevent insertion of a third plug-in unit having a third pitch greater than the first pitch.

10. The shelf of claim 7, wherein the elastic arm of each plug-in unit has one end fixed to a main body thereof.

11. The shelf of claim 7, wherein the elastic arm extends from a fixed end attached to the plug-in unit in a direction opposite to the plug-in direction and remains entirely on one side of the plug-in unit without crossing the opening during elastic deflection.

12. The shelf of claim 7, wherein the socket further comprises a releasing portion, and the elastic arm further comprises a releasing slope configured to cooperate with the releasing portion when the plug-in unit is moved in a direction opposite to the plug-in direction.

* * * * *